United States Patent
Ito

(10) Patent No.: US 9,190,748 B2
(45) Date of Patent: Nov. 17, 2015

(54) CONNECTOR STRUCTURE

(71) Applicant: YAZAKI CORPORATION, Tokyo (JP)

(72) Inventor: Naoki Ito, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 13/974,866

(22) Filed: Aug. 23, 2013

(65) Prior Publication Data

US 2013/0344717 A1 Dec. 26, 2013

Related U.S. Application Data

(63) Continuation of application No. PCT/JP2012/055305, filed on Feb. 24, 2012.

(30) Foreign Application Priority Data

Feb. 25, 2011 (JP) .................. 2011-039244

(51) Int. Cl.
*H01R 12/00* (2006.01)
*H01R 12/71* (2011.01)
(Continued)

(52) U.S. Cl.
CPC ............ *H01R 12/71* (2013.01); *H01R 12/778* (2013.01); *H05K 1/118* (2013.01); *H01R 12/774* (2013.01); *H05K 2201/09181* (2013.01); *H05K 2201/09727* (2013.01); *H05K 2201/2009* (2013.01); *H05K 2203/0228* (2013.01)

(58) Field of Classification Search
USPC ............ 439/78, 79, 492, 493, 55, 59, 61, 65; 216/13

IPC ....................... H01R 12/79, 12/61, 12/62, 12/71
See application file for complete search history.

(56) References Cited

U.S. PATENT DOCUMENTS

| 4,900,268 A | 2/1990 | Kunishi |
| 5,211,565 A | 5/1993 | Krajewski et al. |

(Continued)

FOREIGN PATENT DOCUMENTS

| CN | 101443962 A | 5/2009 |
| JP | 55-105980 U | 7/1980 |

(Continued)

OTHER PUBLICATIONS

Japanese Office Action for the related Japanese Patent Application No. 2011-039244 dated Jul. 30, 2014.

(Continued)

*Primary Examiner* — Vanessa Girardi
(74) *Attorney, Agent, or Firm* — Kenealy Vaidya LLP

(57) ABSTRACT

A connector structure includes a circuit body, a fork terminal, a housing and an insertion member. The circuit body includes a conductor including a two-pronged part having two extended portions, and plated leads arranged at the extended portions respectively. The fork terminal includes a first terminal part and a second terminal part which project from a terminal base so that an insertion space is formed between the first and second terminal parts. The housing includes a fitting part accommodating the fork terminal. The insertion member is inserted into the insertion space through the fitting part in a state where the circuit body is fixed. The circuit body is electrically connected with one of the first and second terminal parts with the insertion of the insertion member.

10 Claims, 6 Drawing Sheets

(51) Int. Cl.
  *H05K 1/11* (2006.01)
  *H01R 12/77* (2011.01)

(56) References Cited

U.S. PATENT DOCUMENTS

| | | | |
|---|---|---|---|
| 6,699,395 | B1 | 3/2004 | Svenkeson et al. |
| 7,387,515 | B2 * | 6/2008 | Watanabe ................. 439/55 |
| 7,445,494 | B2 * | 11/2008 | Wei et al. ................. 439/495 |
| 2008/0156437 | A1 * | 7/2008 | Kawate et al. ............. 156/330 |
| 2010/0151716 | A1 | 6/2010 | Suzuki et al. |
| 2011/0003487 | A1 * | 1/2011 | Xiang et al. ............... 439/59 |

FOREIGN PATENT DOCUMENTS

| JP | 7-192822 A | 7/1995 |
|---|---|---|
| JP | 8-17547 A | 1/1996 |
| JP | 2000-208188 A | 7/2000 |
| JP | 2002-231346 A | 8/2002 |
| JP | 2002-289285 A | 10/2002 |
| JP | 2003-45558 A | 2/2003 |
| JP | 2003-59589 A | 2/2003 |
| KR | 10-2007-0106627 A | 11/2007 |
| TW | 200638823 A | 3/2005 |

OTHER PUBLICATIONS

Korean Office Action for the related Korean Patent Application No. 10-2013-7022393 dated Jul. 10, 2014.
International Search Report and Written Opinion of the International Search Report for PCT/JP2012/055305 dated May 31, 2012.
Japanese Office Action for the related Japanese Patent Application No. 2011-039244 dated Oct. 31, 2014.
Korean Office Action for the related Korean Patent Application No. 10-2013-7022393 dated Jan. 22, 2015.
Chinese Office Action for the related Chinese Patent Application No. 201280010368.5 dated Mar. 11, 2015.
Korean Office Action for the related Korean Patent Application No. 10-2013-7022393 dated Aug. 18, 2015.

* cited by examiner

CONNECTOR STRUCTURE

CROSS REFERENCE TO RELATED APPLICATIONS

This application is a continuation of PCT application No. PCT/JP2012/055305, which was filed on Feb. 24, 2012 based on Japanese Patent Application (No. 2011-039244) filed on Feb. 25, 2011, the contents of which are incorporated herein by reference.

BACKGROUND OF THE INVENTION

1. Field of the Invention

The present invention is related to a circuit body having a plated lead, and a connector structure including this circuit body.

2. Description of the Related Art

A connector structure disclosed in the following PTL 1 includes a housing, a fork terminal, a slider, a flat cable and a cable press member. According to the connector structure of PTL 1, the fork terminal is included as a terminal accommodated in the housing. The slider is included as an insertion member. The flat cable is included as a circuit body. Also, the cable press member is included as a member for fixing the flat cable and being fitted into the slider.

The flat cable is fixed to a lower surface of the slider by the cable press member. The fork terminal accommodated inside the housing has insertion space of the slider between an upside terminal part and a downside terminal part of this fork terminal. When the slider is inserted into the insertion space, the flat cable is in the fixed state, so that a cable conductor makes contact with the downside terminal part and is electrically connected to the downside terminal part.

When the slider in a state of fixing the flat cable is inserted into the insertion space, the fork terminal flexes and is pushed out in a direction in which the upside terminal part and the downside terminal part separate with this insertion. Then, when pinching is performed by a reaction force of this flexure, connection between the downside terminal part and the cable conductor is maintained.

The downside terminal part is connected with the cable conductor in a state where a top of a protrusion formed on the downside terminal part rides on the cable conductor.

CITATION LIST

Patent Literature

[PTL 1] JP-A-2003-45558

SUMMARY OF THE INVENTION

The connector structure of the conventional art of PTL 1 probably causes following problem when the flat cable is formed as, for example, an FPC (Flexible Printed Circuit) and also the cable conductor of this FPC is provided with a plated lead. That is, in the case of connecting the fork terminal to the cable conductor through the plated lead, a situation in which the fork terminal does not ride on the plated lead properly is considered. In this case, runout of the fork terminal or runout of the FPC may occur. When the runout of the fork terminal or the runout of the FPC may occur, defect of conduction occurs. The occurrence of defect of conduction will hereinafter be described concretely with reference to the drawings.

FIGS. 6A and 6B show a part of the FPC. In the drawings, reference numeral 1 shows a base material. Also, reference numeral 2 shows a conductor made of metal foil. Further, reference numeral 3 shows a plated lead continuous with the conductor 2. The conductors 2 with which the plated leads 3 are conducted are juxtaposed on the base material 1 at a predetermined spacing. An end 4 of the plated lead 3 is disposed so as to match with an end 5 of the base material 1. A line width of the plated lead 3 is formed sufficiently thinner than a line width of the conductor 2. This is because at the time of manufacturing the FPC, an external shape of the FPC is cut out by cutting equipment and wear of the cutting equipment advances rapidly in a case that the line width of the plated lead 3 is wide. Because of this, the line width of the plated lead 3 is formed to be relatively thin, i.e., thinner than a line width of the conductor 2, in order to slow this wear procedure. The line width of the plated lead 3 is set according to a terminal width of, for example, a fork terminal 6 (see FIG. 6C) used as the mating side of electrical connection.

The fork terminal 6 is accommodated and fixed in a housing. Also, the FPC is fixed to an insertion member fitted into the housing. The housing and the insertion member have a structure of connector fitting.

In the structure described above, when the connector fitting between the housing and the insertion member is started, the FPC is inserted into the fork terminal 6 of the inside of the housing and in this case, a connection part of the fork terminal 6 becomes riding over the plated lead 3. Then, when the FPC is inserted to a predetermined position, electrical connection is completed.

Incidentally, when a position of the fork terminal 6 does not match with a position of the plated lead 3, the fork terminal 6 does not ride over a thickness T of the plated lead 3 and as shown by arrow P, the fork terminal 6 may avoid the FPC. Or, as shown by arrow Q, the FPC may avoid the fork terminal 6. Therefore, in such cases, defect of conduction occurs.

In addition, strict alignment between the plated lead 3 and the fork terminal 6 could be designed, but such a countermeasure has a problem that manufacturing dimension tolerance or assembly dimension tolerance of components becomes strict. Also, a multipole connector structure in which the cumulative dimension tolerance of components becomes large has a problem of becoming difficult to handle its dimension tolerance.

It is therefore one advantageous aspect of the present invention to provide a circuit body and a connector structure capable of preventing occurrence of defect of conduction.

According to one advantage of the invention, there is provided a circuit body comprising:

a conductor including a two-pronged part having two extended portions; and plated leads arranged at the extended portions respectively.

A width of the conductor may be equal to a width of the two-pronged part.

According to another one advantage of the invention, there is provided a connector structure, comprising:

the circuit body;

a fork terminal including a first terminal part and a second terminal part which project from a terminal base so that an insertion space is formed between the first and second terminal parts;

a housing including a fitting part accommodating the fork terminal; and an insertion member inserted into the insertion space through the fitting part in a state where the circuit body is fixed, wherein the circuit body is electrically connected with one of the first and second terminal parts with the insertion of the insertion member.

According to the invention, in the case of normal connection without misalignment, a mating terminal is first inserted into the two-pronged part and then, when the mating terminal rides over in a back position of the two-pronged part, connection is completed. On the other hand, in the case of misaligned connection which causes defect of conduction conventionally, the plated leads are present in both sides of the two-pronged part in the invention, so that the mating terminal rides over the plated leads and thereby, connection is completed. It is more preferable to match a width of the two-pronged part with a width of the mating terminal targeted for connection in the invention. The two-pronged part could have substantially a concave shape, and is preferably formed in substantially a U shape or substantially a V shape.

Accordingly, the invention has an effect capable of preventing occurrence of defect of conduction since the two-pronged part is formed and also the plated leads are arranged in both sides of this two-pronged part.

According to the invention, even when the line width of the arrangement portion of the plated leads is made substantially equal to the line width of the conductor, the two-pronged part is provided between the plated leads, so that the plated leads are widely formed practically. Therefore, a wear procedure of cutting equipment can be slowed in manufacture of the circuit body. Also, according to the invention, the line width of the arrangement portion of the plated leads is made substantially equal to the line width of the conductor, so that misalignment can be reduced in a wide range.

Accordingly, the invention has an effect capable of providing one better form of the plated leads.

According to the invention, when connector fitting of the housing and the insertion member is performed, the circuit body is inserted into the insertion space of the fork terminal through the insertion member. At this time, the fork terminal surely rides over the plated leads or the back position of the two-pronged part and thereby, connection is completed. According to the invention, the fork terminal does not avoid the circuit body or the circuit body does not avoid the fork terminal, with the result that sure connection can be made.

Accordingly, the invention has an effect capable of forming the connector structure without defect of conduction since the circuit body having the two-pronged part and the plated leads in both sides of this two-pronged part is included.

BRIEF DESCRIPTION OF THE DRAWINGS

FIG. 1A is a side view, and FIG. 1B is a bottom view including a partially enlarged view.

FIG. 2A is a plan view, and FIG. 2B is a side view.

FIG. 3A is a side view during the fitting, and FIG. 3B is a side view at the time of completing the fitting.

FIG. 4A is a diagram during the connection, FIG. 4B is a diagram at the time of completing connection, and FIG. 4C is a diagram during connection having misalignment.

FIGS. 6A and 6B are diagrams showing a part of an FPC, and FIG. 6C is a diagram showing occurrence of defect of conduction.

DETAILED DESCRIPTION OF THE EXEMPLARY EMBODIMENTS

A circuit body has a conductor, a plated lead and a two-pronged part. The two-pronged part has two extended portions. The plated leads are arranged in the two extended portions respectively. Namely, the plated leads are arranged in both sides of the two-pronged part. A connector structure includes the circuit body in a configuration, and a fork terminal is electrically connected to the circuit body when connector fitting is performed.

Figure 1A:
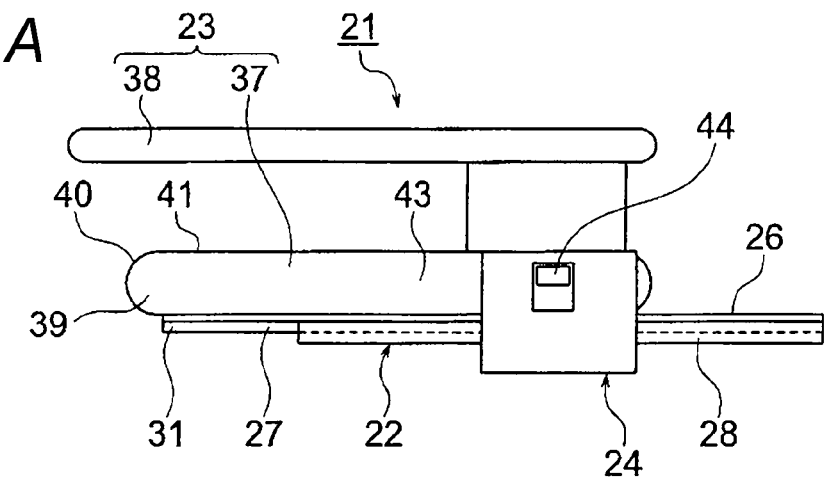
FIGS. 1A and 1B are diagrams showing an FPC assembly including a part of a connector structure and a circuit body of the invention.
Figure 1B:
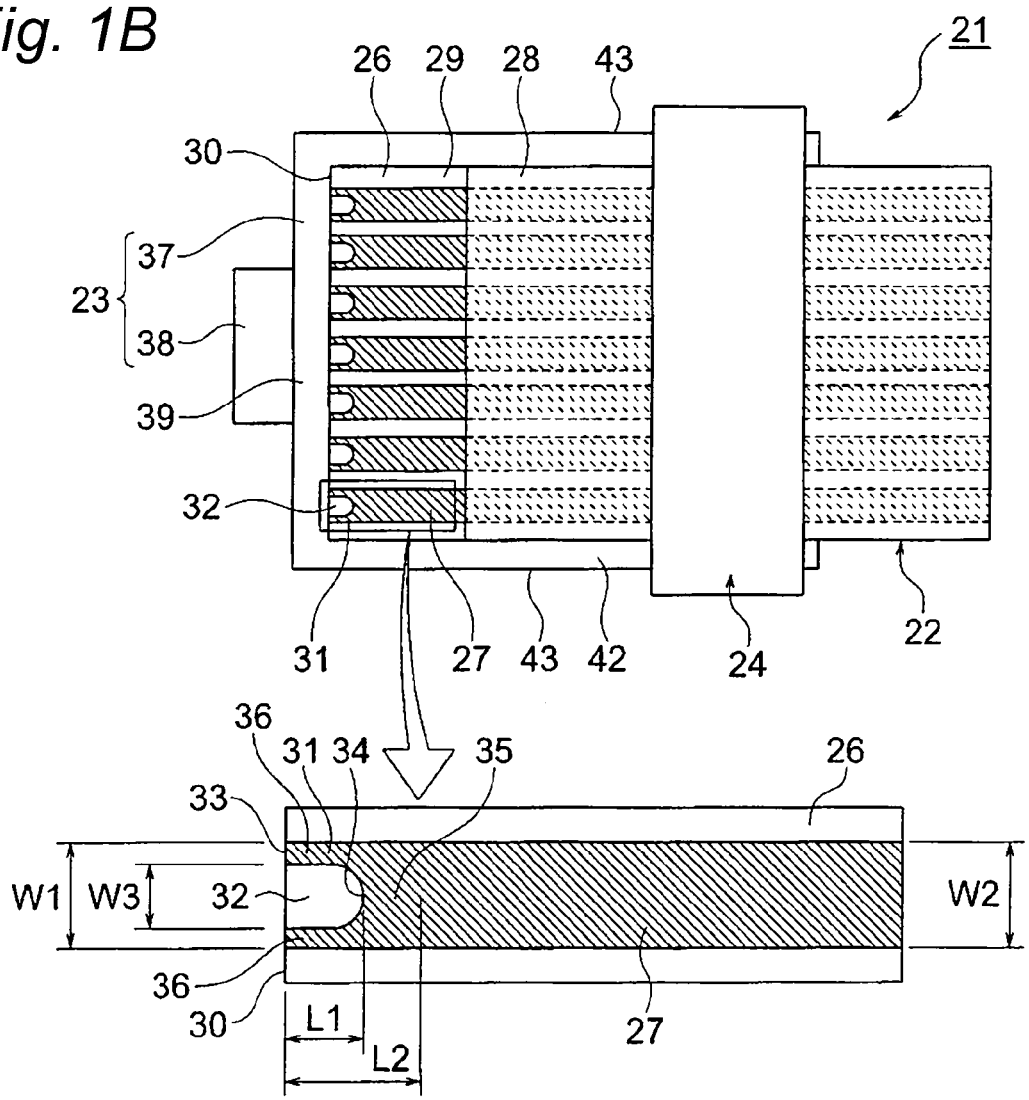
Figure 2A:
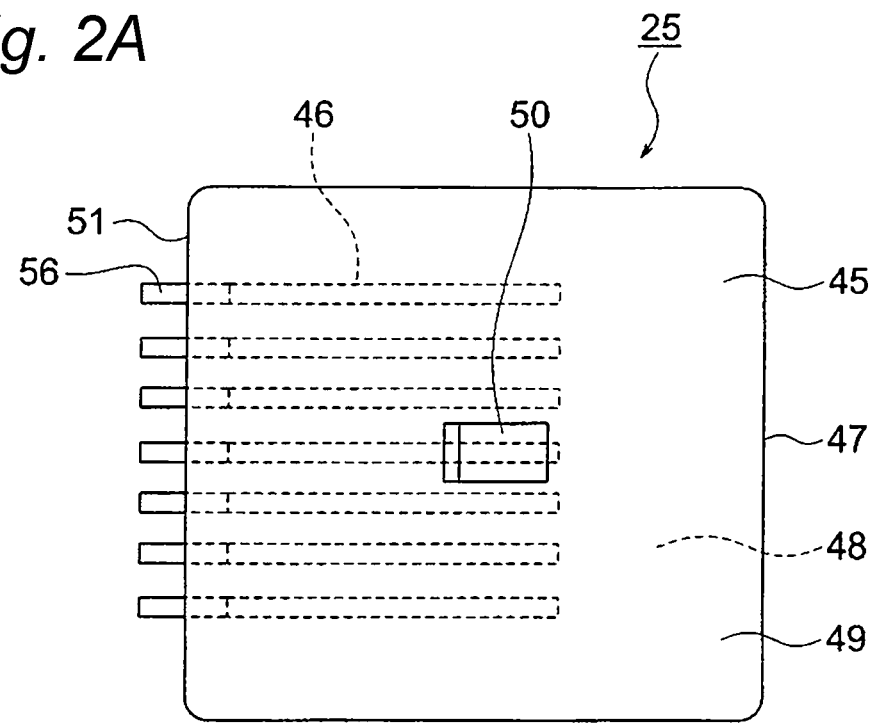
FIGS. 2A and 2B are diagrams showing a female connector used as the mating side of fitting of the FPC assembly of FIGS. 1A and 1B.
Figure 2B:
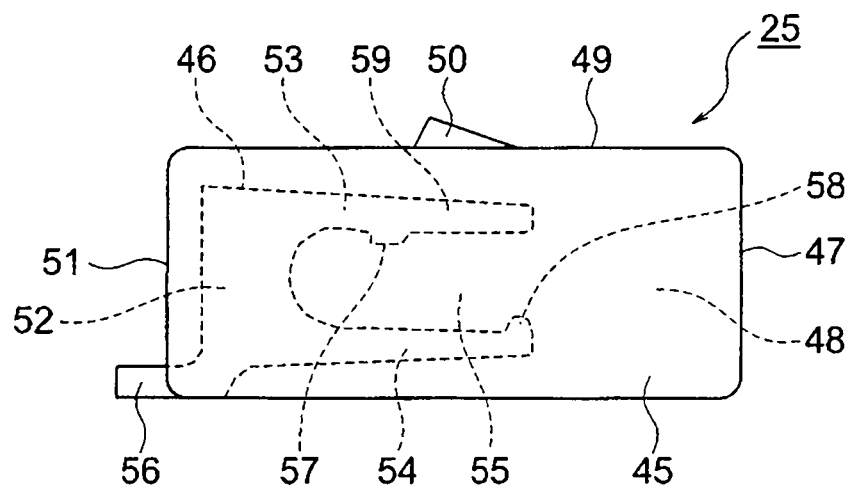
Figure 3A:
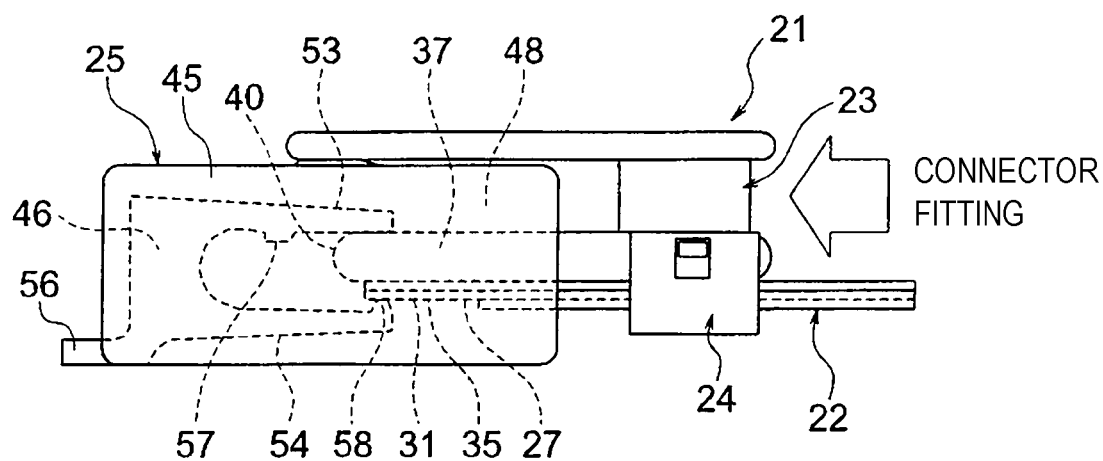
FIGS. 3A and 3B are diagrams related to connector fitting.
Figure 3B:
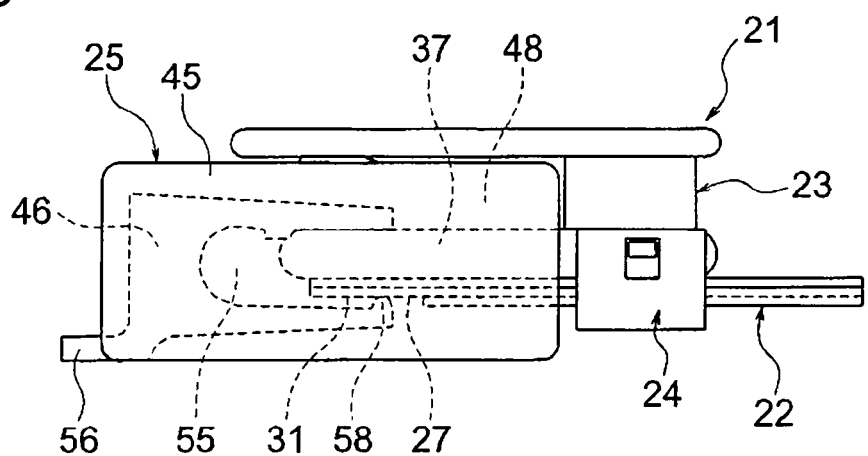
Figure 4A:
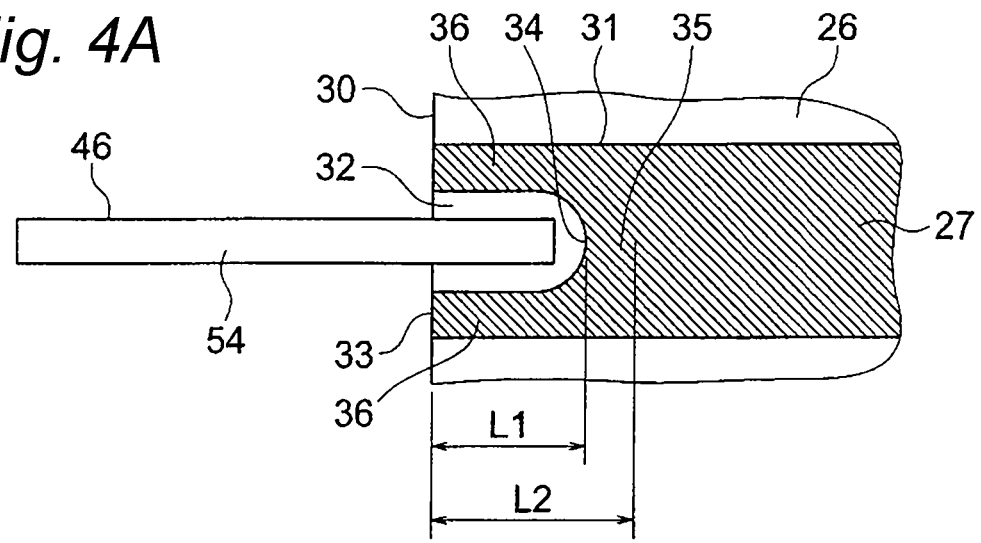
FIGS. 4A to 4C are diagrams related to connection of a fork terminal.
Figure 4B:
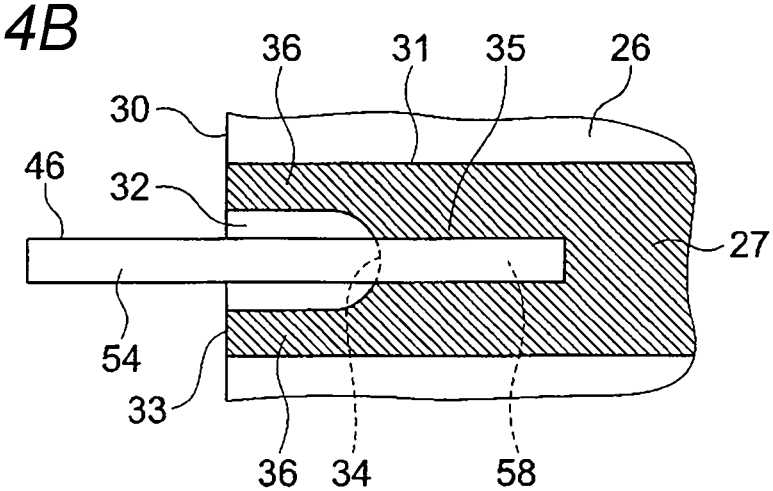
Figure 4C:
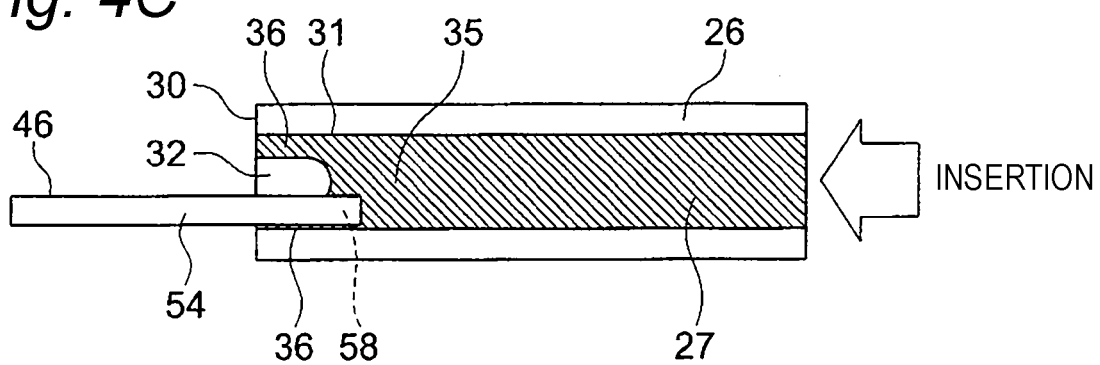

A first embodiment will hereinafter be described with reference to the drawings. FIGS. 1A and 1B are diagrams showing an FPC assembly including a part of a connector structure and a circuit body of the invention. Also, FIGS. 2A and 2B are diagrams showing a female connector, and FIGS. 3A and 3B are diagrams related to connector fitting, and FIGS. 4A to 4C are diagrams related to connection of a fork terminal.

In FIGS. 1A and 1B, reference numeral 21 shows the FPC assembly. The FPC assembly 21 includes an FPC 22 as one example of a circuit body, a slider 23 (an insertion member) made of synthetic resin having insulation properties, and a holder 24 locked in the slider 23 so as to press the FPC 22. The FPC assembly 21 is constructed so as to be fitted into a female connector 25 by a connector. First, each of the components described above will be described.

The FPC 22 is a publicly known flexible printed circuit, and is a kind of circuit body capable of being applied to the invention. The FPC 22 has a base material 26 having insulation properties, plural conductors 27 juxtaposed in one row sideways at a predetermined spacing, and a coat part 28 having insulation properties.

The plural juxtaposed conductors 27 are made of metal foil which is copper foil for example, and are fastened on the base material 26. The conductors 27 are insulated from the outside by being covered with the coat part 28. Reference numeral 29 in the FPC 22 shows a conductor exposed part. This conductor exposed part 29 is formed as the portion in which the conductor 27 is exposed from the coat part 28 in a predetermined length from an end 30 of the FPC 22. An end of the conductor 27 in an exposed state in the conductor exposed part 29 is provided with a terminal connection part 31 continuously.

The terminal connection part 31 is formed as an electrical connection portion and as a portion which a fork terminal 46 described below of the female connector 25 rides over. Further, the terminal connection part 31 is formed as an arrangement portion of a plated lead 36 described below. The terminal connection part 31 is formed so that a line width W1 becomes equal to a line width W2 of the conductor 27 in the present embodiment. A two-pronged part 32 is formed in the terminal connection part 31 of such a line width W1. The two-pronged part 32 is notched and formed using substantially the center of an end 33 in the terminal connection part 31 as a notch start position. In the embodiment, the two-pronged part 32 is notched and formed in substantially a U shape having two extended portions. Other notch examples will be described in a second embodiment.

A distance L1 from the end 30 of the FPC 22 to a back position 34 of the two-pronged part 32 is constructed so as to become shorter than a distance L2 from the end 30 to a connection completion position of the fork terminal 46 described below. Also, a width W3 of the two-pronged part 32 becomes larger than a terminal width of the fork terminal 46 described below. In addition, a thickness of the portion which the fork terminal 46 described below rides over shall be a thickness T similar to the conventional thickness. The fork terminal 46 is constructed so as to be inserted into the two-pronged part 32 in a state in which the fork terminal 46 described below is not misaligned (see FIG. 4B) or is slightly misaligned.

The terminal connection part 31 continuous with the conductor 27 has the following portion in addition to the two-pronged part 32. That is, a connection part 35 is provided as a portion which is set in the connection completion position and continuous with the back position 34 of the two-pronged part 32. Also, the plated leads 36 are arranged in the two extended portions respectively. Namely, the plated leads 36 are provided as the portions continuous with both outsides of the two-pronged part 32. The connection part 35 is formed as the portion of connection to the fork terminal 46 described below. The fork terminal 46 is constructed so as to ride over the plated leads 36 and reach the connection part 35 and be electrically connected to the connection part 35 if misalignment occurs.

The terminal connection part 31 is formed so that this line width W1 is substantially equal to the line width W2 of the conductor 27, but has the two-pronged part 32, so that the terminal connection part 31 has an effect capable of narrowly forming the plated leads 36 practically as is conventionally done. Then, this effect also exerts an effect capable of slowing a wear procedure of cutting equipment in manufacture of the FPC 22.

In addition, a publicly known FFC (flexible flat circuit) etc. are given as the applicable circuit body other than the FPC 22. The invention is not limited to the above as long as the circuit body is a circuit body capable of being electrically connected to the fork terminal 46 described below.

The slider 23 has a slider body 37 and a lock arm part 38 integrated with this slider body 37. The slider body 37 is formed as a portion inserted into a fitting part 48 described below of the female connector 25. Also, the top portion (insertion top portion 39) of the slider body 37 is formed as a portion inserted into the fork terminal 46 described below.

The lock arm part 38 is formed in a cantilevered arm shape having flexibility. The lock arm part 38 is constructed so that a lock hole part (not shown) formed in this lock arm part 38 is hooked and locked in a lock claw part 50 described below of the female connector 25. The lock arm part 38 is formed as a portion contributing to maintenance of an electrical connection state or prevention of detachment of slider 23.

The insertion top portion 39 has an abutting part 40 for positioning and a pressed holding surface part 41. The abutting part 40 for positioning is arranged and formed on the upper surface side in a top position of the slider body 37. The abutting part 40 for positioning is formed as a portion abutting on a projection 57 for positioning of the fork terminal 46 described below. The slider body 37 is constructed so as to regulate insertion when this abutting part 40 for positioning abuts on the projection 57 for positioning.

The pressed holding surface part 41 is formed on an upper surface of the slider body 37 as a portion pressed and held by a pressing holding surface part 59 of a first terminal part 53 of the fork terminal 46 described below. The pressed holding surface part 41 is arranged and formed so as to be continuous with the abutting part 40 for positioning. Reference numeral 42 shows an FPC fixing part. This FPC fixing part 42 is arranged and formed on a lower surface of the slider body 37 as a portion for fixing the FPC 22.

The slider body 37 has locking protrusions 44 on both side surfaces 43 of this slider body 37. The locking protrusion 44 is formed in substantially a claw shape so that the holder 24 can be locked.

In FIGS. 2A and 2B, the female connector 25 is a connector mounted in a substrate (not shown), and is configured to include a female housing 45 (housing) made of synthetic resin having insulation properties and plural fork terminals 46 having conductivity accommodated and fixed in this female housing 45.

The female housing 45 is formed in a rectangular box shape in the embodiment. The female housing 45 has the fitting part 48 formed by opening a front surface 47 of this female housing 45. The fitting part 48 is formed as a portion for receiving the fork terminal 46. Also, the fitting part 48 is formed as a portion for inserting the FPC assembly 21 and fitting a connector.

The female housing 45 has the lock claw part 50 in substantially a center position of an upper surface 49 of this female housing 45. The lock claw part 50 is formed so as to project from the upper surface 49 in substantially a claw shape. The lock claw part 50 is formed so that the FPC assembly 21 can be locked.

The female housing 45 is formed so as to expose a part of the fork terminal 46 from a back surface 51 of this female housing 45.

The fork terminal 46 is formed by pressing a metal plate having conductivity and also a predetermined thickness. The fork terminal 46 is formed in a shape of a female terminal. The fork terminal 46 has a terminal base 52, a first terminal part 53 and a second terminal part 54 respectively projecting from an upper end and a lower end of this terminal base 52, insertion space 55 formed between the first terminal part 53 and the second terminal part 54, and a substrate connection part 56 exposed from the back surface 51 of the female housing 45, and is formed in the illustrated shape.

The first terminal part 53 arranged in the upper side and the second terminal part 54 arranged in the lower side have resilience in which distal positions of these terminal parts can separate slightly. The distal end positions are free ends. The projection 57 for positioning is projected and formed in an intermediate position of the first terminal part 53 of such a first terminal part 53 and a second terminal part 54. On the other hand, a projection 58 for connection is projected and formed in a distal position of the second terminal part 54. The projection 57 for positioning and the projection 58 for connection are respectively arranged and formed so as to project to the side of the insertion space 55.

The projection 57 for positioning is formed as a portion for determining an insertion position of the FPC assembly 21. The projection 57 for positioning is formed so as to function as the so-called stopper. The projection 57 for positioning is present in the intermediate position of the first terminal part 53 as described above, and is arranged and formed in a back position from the projection 58 for connection. The portion between the projection 57 for positioning and the distal end of the first terminal part 53 is formed as the pressing holding surface part 59 for pressing and holding an insertion portion of the FPC assembly 21.

The projection 58 for connection is formed as a portion for making contact with the connection part 35 of the terminal connection part 31 in the FPC 22. The projection 58 for connection is formed so as to have a angle shape in side view. In addition, the shape is not particularly limited as long as electrical connection can be made.

Next, assembly of the FPC assembly 21 and the female connector 25 and also electrical connection will be described based on the structure described above.

In the female connector 25, assembly is completed by receiving the plural fork terminals 46 in the fitting part 48 of the female housing 45. Also, in the FPC assembly 21, assembly is completed by fixing the FPC 22 to the FPC fixing part 42 in a lower surface of the slider body 37 and also locking the holder 24.

When connector fitting is performed by sliding the FPC assembly 21 into the female connector 25 as shown in FIG. 3A after the assembly described above, electrical connection is completed together with this fitting. Concretely, the slider body 37 in a state of fixing the FPC 22 is inserted into the fitting part 48 of the female housing 45 and also the insertion top portion 39 of the slider body 37 is inserted between the first terminal part 53 and the second terminal part 54 of the fork terminal 46 and when this insertion is performed to the following state, electrical connection is completed. That is, when the abutting part 40 for positioning of the insertion top portion 39 is inserted until the abutting part 40 abuts on the projection 57 for positioning of the first terminal part 53, at this time, the connection part 35 in the terminal connection part 31 of the FPC 22 in a state of being fixed to the FPC fixing part 42 makes contact so as to ride over the projection 58 for connection of the second terminal part 54 and thereby, electrical connection is completed.

The insertion top portion 39 of the slider body 37 is pressed from the first terminal part 53 with the insertion described above. Therefore, a state of contact between the connection part 35 and the projection 58 for connection is maintained. Also, the lock hole part (not shown) of the lock arm part 38 in the slider 23 is hooked and locked in the lock claw part 50 of the female housing 45. Therefore, detachment of the FPC assembly 21 is regulated and the state of contact between the connection part 35 and the projection 58 for connection is maintained.

The electrical connection mentioned above will be described more concretely with reference to FIGS. 4A to 4C.

In FIG. 4A, in the case of normal connection without misalignment, the second terminal part 54 of the fork terminal 46 is first inserted into the two-pronged part 32. Then, when the second terminal part 54 rides over the back position 34 of the two-pronged part 32, connection is completed at the connection part 35 of the terminal connection part 31 as shown in FIG. 4B. On the other hand, in the case of misaligned connection, as shown in FIG. 4C, both sides of the two-pronged part 32 have the plated leads 36, so that the second terminal part 54 of the fork terminal 46 makes contact with the connection part 35 after the second terminal part 54 rides over the plated leads 36. Consequently, connection is completed.

As described above with reference to FIGS. 1A to 4C, according to the invention, the terminal connection part 31 has the two-pronged part 32 and also has the plated leads 36 in both sides of this two-pronged part 32 and further has the connection part 35 continuous with the two-pronged part 32 and the plated leads 36, so that electrical connection can be made surely, with the result that there is an effect capable of preventing occurrence of defect of conduction. Also, the invention has an effect capable of forming a connector structure without defect of conduction by surely making electrical connection.

Figure 5A:
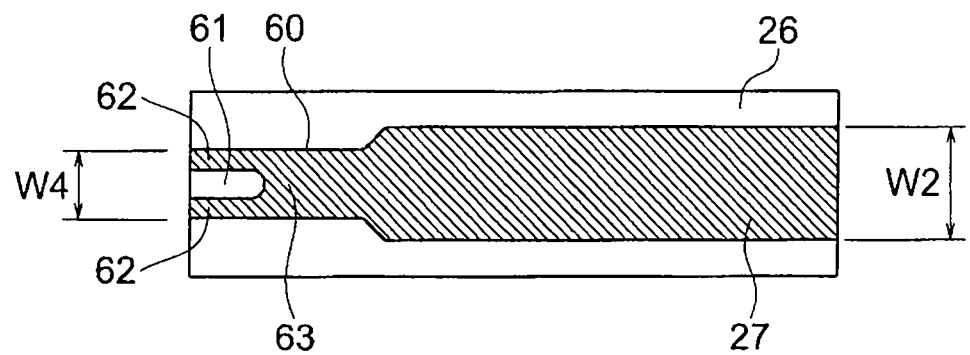
FIGS. 5A to 5C are diagrams related to another example of a terminal connection part including a two-pronged part and plated leads.
Figure 5B:
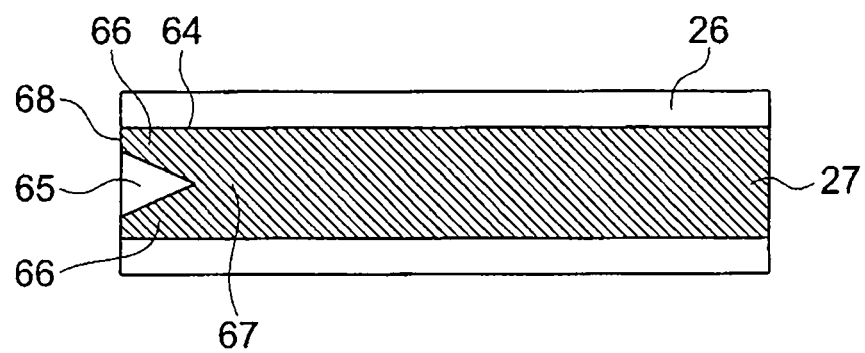
Figure 5C:
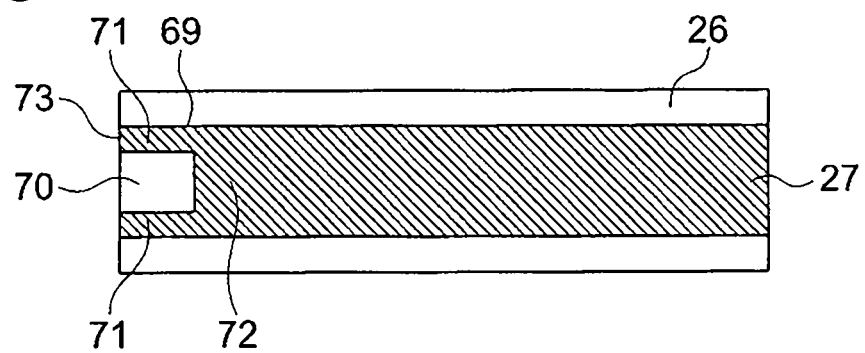
Figure 6A:
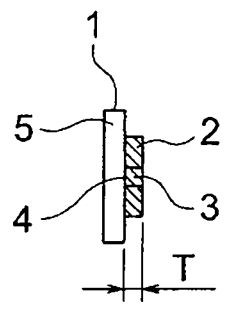
FIGS. 6A to 6C are diagrams related to a conventional example.
Figure 6B:
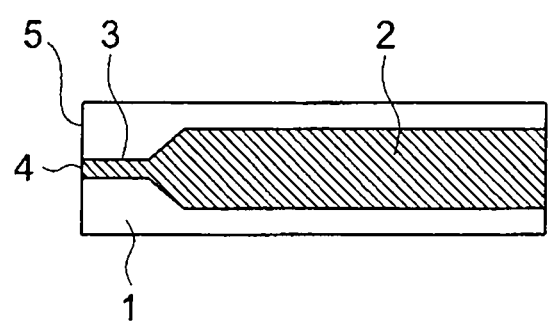
Figure 6C:
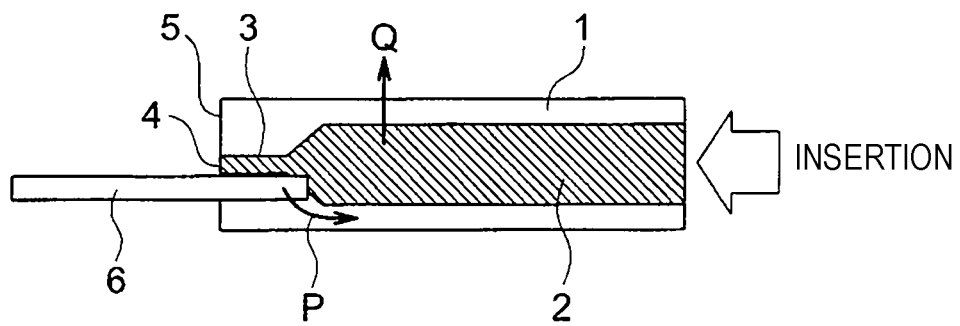

A second embodiment will hereinafter be described with reference to the drawing. FIGS. 5A to 5C are diagrams related to another example of a terminal connection part including a two-pronged part and plated leads. In addition, detailed description is omitted by assigning the same numerals to the same components as those of the first embodiment.

In FIG. 5A, a terminal connection part 60 is formed so that a line width W4 of this terminal connection part 60 becomes slightly thinner than a line width W2 of a conductor 27. Such a terminal connection part 60 has a two-pronged part 61, plated leads 62 and a connection part 63. The two-pronged part has two extended portions having the line width W4. The plated leads are arranged in the two extended portions respectively. Namely, the plated leads 62 are arranged and formed in both sides of the two-pronged part 61. It goes without saying that the terminal connection part 60 as described above also has an effect similar to that of the first embodiment.

In FIG. 5B, a terminal connection part 64 has a two-pronged part 65, plated leads 66 and a connection part 67. The two-pronged part has two extended portions having substantially a V shape. The plated leads are arranged in the two extended portions respectively. Namely, the plated leads 66 are arranged and formed in both sides of the two-pronged part 65. The two-pronged part 65 is notched and formed in the V shape using substantially the center of an end 68 as a notch start position. It goes without saying that the terminal connection part 64 as described above also has an effect similar to that of the first embodiment.

In FIG. 5C, a terminal connection part 69 has a two-pronged part 70, plated leads 71 and a connection part 72. The two-pronged part has two extended portions formed by a square concave shape. The plated leads are arranged in the two extended portions respectively. Namely, the plated leads 71 are arranged and formed in both sides of the two-pronged part 70. The two-pronged part 70 is notched and formed in substantially the square concave shape using substantially the center of an end 73 as a notch start position. It goes without saying that the terminal connection part 69 as described above also has an effect similar to that of the first embodiment.

It is to be noted that the invention is not limited to the above described embodiments, but various modifications, improvements, and so on can be appropriately made. Besides, materials, shapes, sizes, numbers, positions to be arranged, and so on of constituent elements in the above described embodiment are not limited, provided that the invention can be achieved.

A circuit body and connector structure according to the present invention can achieve an effect capable of forming the connector structure without defect of conduction since the circuit body having the two-pronged part and the plated leads in both sides of this two-pronged part is included.

What is claimed is:

1. A connector structure, comprising:
    a circuit body including a conductor including a two-pronged part having two extended portions, and plated leads arranged at the extended portions respectively;
    a fork terminal including a first terminal part and a second terminal part which project from a terminal base so that an insertion space is formed between the first and second terminal parts;
    a housing including a fitting part accommodating the fork terminal; and
    an insertion member inserted into the insertion space through the fitting part in a state where the circuit body is fixed,
    wherein the circuit body is electrically connected with one of the first and second terminal parts with the insertion of the insertion member, and
    wherein the first terminal part is formed with a positioning projection projected therefrom and configured to abut the insertion member in an insertion direction so as to prevent further insertion of the insertion member.

2. The connector structure as set forth in claim 1, wherein a width of the conductor is equal to a width of the two-pronged part.

3. The connector structure as set forth in claim 1, wherein a width of one of the first terminal part and the second terminal part of the fork terminal is approximately equal to a width of one of the two extended portions of the two-pronged part.

4. The connector structure as set forth in claim 1, wherein the two-pronged part is configured such that the two extended portions are separated by a triangular gap.

5. The connector structure as set forth in claim 1, wherein the two-pronged part is configured such that the two extended portions are separated by a rectangular gap.

6. The connector structure as set forth in claim 1, wherein the two extended portions of the two-pronged part are connected by a curved surface.

7. The connector structure as set forth in claim 1, wherein the insertion member includes a slider body that is configured for insertion into the insertion space through the fitting part, and a lock arm part that extends over the slider body and outside of the insertion space when the slider body is inserted into the insertion space.

8. The connector structure as set forth in claim 7, wherein the lock arm part extends substantially parallel to the slider body and defines an aperture that faces the slider body, and the housing includes a lock claw at an exterior surface thereof that is configured to extend within the aperture.

9. The connector structure as set forth in claim 7, wherein one of the first terminal part and the second terminal part defines a stopper that is configured to communicate with the slider body to facilitate a predetermined positioning of the slider body within the insertion space.

10. The connector structure as set forth in claim 9, wherein the other of the first terminal part and the second terminal part defines a projection for forming an electrical connection at a connection point.

* * * * *